US006859770B2

(12) United States Patent
Ramsey

(10) Patent No.: US 6,859,770 B2
(45) Date of Patent: Feb. 22, 2005

(54) METHOD AND APPARATUS FOR GENERATING TRANSACTION-BASED STIMULUS FOR SIMULATION OF VLSI CIRCUITS USING EVENT COVERAGE ANALYSIS

(75) Inventor: Clinton M. Ramsey, Plano, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 824 days.

(21) Appl. No.: 09/727,188

(22) Filed: Nov. 30, 2000

(65) Prior Publication Data

US 2002/0065640 A1 May 30, 2002

(51) Int. Cl.[7] .............................................. G06F 17/50
(52) U.S. Cl. ............................ 703/16; 703/14; 703/17; 717/135
(58) Field of Search ............................ 703/14, 15, 16; 714/739, 738; 702/183; 717/135

(56) References Cited

U.S. PATENT DOCUMENTS

| | | | | |
|---|---|---|---|---|
| 5,404,360 A | * | 4/1995 | Suzuki et al. ................... | 714/27 |
| 5,729,554 A | * | 3/1998 | Weir et al. .................... | 714/739 |
| 5,956,476 A | | 9/1999 | Ranson et al. ........... | 395/183.06 |
| 6,018,623 A | | 1/2000 | Chang et al. ........... | 395/500.07 |
| 6,249,755 B1 | * | 6/2001 | Yemini et al. ............... | 702/183 |
| 6,618,856 B2 | * | 9/2003 | Coburn et al. ............... | 717/135 |

OTHER PUBLICATIONS

"Statistical Modeling for Efficient Parametric Yield Estimation of MOS VLSI Circuits" Paul Cox et al., IEEE Trans. Electron. Devices, vol. ED–32 No. 2, pp. 471–478, 1985.

* cited by examiner

*Primary Examiner*—Albert W. Paladini

(57) ABSTRACT

The present invention applies genetic algorithmic generation of test cases the simulation of VLSI logic circuit blocks. The present invention generates a number of original test cases. This aggregate of solutions is provided to a circuit simulator. The results of the simulator are maintained in a matrix or table. The results detail the number of times that particular logic states or events associated with the VLSI block have been stimulated by particular test cases. The aggregate of solutions and the simulation results are then analyzed by the genetic algorithm. The genetic algorithm preferably identifies states associated with the circuit simulation that have not been produced by the original test cases. The genetic algorithm then combines characteristics of various test cases to generate new test cases. The new test cases are provided to the circuit simulator thereby providing a higher degree of confidence that the entire VLSI chip design has been simulated.

20 Claims, 2 Drawing Sheets

| | | TEST CASE 1 | TEST CASE 2 | TEST CASE 3 | TEST CASE 4 | TOTAL |
|---|---|---|---|---|---|---|
| EVENT 1 | JKU | 0 | 0 | 0 | 0 | 0 |
| EVENT 2 | JK$\overline{U}$ | 10 | 0 | 2 | 5 | 17 |
| EVENT 3 | KU | 7 | 0 | 2 | 0 | 9 |
| ⋮ | ⋮ | ⋮ | ⋮ | ⋮ | ⋮ | ⋮ |
| EVENT N | XYJ | 20 | 50 | 2 | 0 | 72 |

| | | | |
|---|---|---|---|
| TEST CASE 1 | 101 R | 137 W | 173 T |
| TEST CASE 2 | 101 Q | 137 R | 173 W |
| TEST CASE 3 | 101 M | 137 N | 173 Q |
| TEST CASE 4 | 101 R | 137 S | 173 T |

| INSTRUCTION | SCORE |
|---|---|
| R | 114 |
| W | 104 |
| T | 64 |
| Q | 58 |
| S | 10 |
| M | 10 |
| N | 10 |

| | | TEST CASE 1 | TEST CASE 2 | TEST CASE 3 | TEST CASE 4 | TOTAL |
|---|---|---|---|---|---|---|
| EVENT 1 | JKU | 0 | 0 | 0 | 0 | 0 |
| EVENT 2 | JKŪ | 10 | 0 | 2 | 5 | 17 |
| EVENT 3 | KU | 7 | 0 | 2 | 0 | 9 |
| ⋮ | ⋮ | ⋮ | ⋮ | ⋮ | ⋮ | ⋮ |
| EVENT N | XYJ | 20 | 50 | 2 | 0 | 72 |

| TEST CASE 1 | 101 R | 137 W | 173 T |
|---|---|---|---|
| TEST CASE 2 | 101 Q | 137 R | 173 W |
| TEST CASE 3 | 101 M | 137 N | 173 Q |
| TEST CASE 4 | 101 R | 137 S | 173 T |

| INSTRUCTION | SCORE |
|---|---|
| R | 114 |
| W | 104 |
| T | 64 |
| Q | 58 |
| S | 10 |
| M | 10 |
| N | 10 |

US 6,859,770 B2

METHOD AND APPARATUS FOR GENERATING TRANSACTION-BASED STIMULUS FOR SIMULATION OF VLSI CIRCUITS USING EVENT COVERAGE ANALYSIS

RELATED APPLICATIONS

The present application is related to concurrently filed, co-pending, and commonly assigned U.S. patent application Ser. No. 09/728,135, entitled "METHOD AND APPARATUS FOR ENCODING AND GENERATING TRANSACTION-BASED STIMULUS FOR SIMULATION OF VLSI CIRCUITS," the disclosure of which is hereby incorporated herein by reference.

TECHNICAL FIELD

This invention relates in general to genetic algorithmic directed generation of transaction stimuli states and more particularly to the construction of new test stimuli from already occurring test stimuli via a genetic algorithm, thereby reaching new constructed states that are not generated by already occurring stimuli.

BACKGROUND

Simulating integrated circuits has proved to be a very useful process for finding circuit design problems before product release. In particular, known testing techniques have been directed to CPUs (central processing units) and associated buses. Typically, in testing VLSI (very large-scale integrated) circuits such as these, a large number of different test cases are processed in order to uncover problem states. An example of test cases may be found in U.S. Pat. No. 5,956,476 to Ransom et al., which is incorporated herein by reference. In previous approaches, a large number of cases might be randomly generated by specifying a weighted mix of transaction (e.g., read, write) types. For example, a mixture of 20% reads and 80% writes, might be generated. However, the timing relationship between any of the events is neither specified nor controllable when random generation is utilized.

FIG. 1 illustrates an exemplary topology utilized by known circuit simulation techniques. VLSI 101 is associated with two separate stimuli: internal bus 102 and external bus 104 of bus interface unit 103. It is appropriate to generate a number of test states associated with these two stimuli. Most pairs of stimuli do not lead to any problems. Accordingly, it is appropriate to isolate the problem states (i.e., pairs of stimuli) that give rise to circuit malfunction. In addition, it shall be appreciated that there is an additional degree of freedom associated with problem states. Specifically, problem states that are separated in time may nevertheless lead to problematic circuit behavior.

As previously noted, test cases for application to such a system topology may be randomly generated. Random generation is illustrated in Cox, P., et al. "Statistical Modeling for Efficient Parametric Yield Estimation of MOS VLSI Circuits", IEEE Trans. Electron. Devices, vol. ED-32 No. 2, 471–478, 1985, which is incorporated herein by reference. Another example of random generation of test cases is included in U.S. Pat. No. 6,018,623 to Chang et al., which is incorporated herein by reference.

Also, known techniques utilized to ascertain problem states include manual development of test cases. For example, a transaction might be set up on an external bus at time to and then have a transaction injected onto the internal bus at a time $t = t_0 - t_A$. Also, $t_A$ is initially set to equal $t_1$ and successively varied until t equals time $t_0$. Also, $t_A$ may be varied until it reaches $-t_1$. The hypothesis is that if there is any important timing relationship between the two transactions, that relationship would be discovered by exhaustively iterating the relative times of the two transactions.

Random generation of test states is fairly automatic. However, the amount of computational effort necessary to cover desired events can be very large. Also, random generation is problematic in that it is often difficult to repeat problem states. For example, if something changes in the execution of the model of the circuit under test, a purely random string of transactions may not re-trigger that event. Alternatively, handwritten generation of test states may identify problem states more easily. However, handwritten generation of states requires extensive hand coding by someone who has extensive knowledge of the system under test. Specifically, this technique requires significant input from highly skilled personnel.

SUMMARY OF THE INVENTION

Accordingly, there is a need in the art for the automatic generation of test states while fully simulating logic block circuits. In particular, there is a need in the art for a system and method of test state generation that requires minimal input from highly skilled personnel while providing clear and repeatable test results.

The present invention is directed to a system and method utilized to construct new test states from an existing set of test states and result data. The system and method are preferably implemented via genetic algorithmic generation of test states to provide a test set which, in turn, generates output states. A genetic algorithm is an algorithm that utilizes existing non-optimal solutions that provide a degree of utility to form other solutions that provide a greater degree of utility. Specifically, a genetic algorithm analyzes existing solutions and characteristics associated with those solutions. Advantageous characteristics from a number of existing solutions are combined to form new solutions which, in turn, are applied to a specific application. A genetic algorithm generally involves creating a systematic encoding nomenclature to describe solutions. Furthermore, a genetic algorithm generally involves providing a mechanism to evaluate solutions. Also, genetic algorithms provide a mechanism to describe characteristics of the various solutions.

In the present system and method, the genetic algorithmic generation is preferably applied to the simulation of VLSI logic circuit blocks. The system and method preferably utilize the solution nomenclature set forth in related application, U.S. patent application Ser. No. 09/728,135, entitled "METHOD AND APPARATUS FOR ENCODING AND GENERATING TRANSACTION-BASED STIMULUS FOR SIMULATION OF VLSI CIRCUITS," the disclosure of which is incorporated herein by reference. Also, the system and method preferably generate a number of original test cases (solutions) as described in the preceding related application. Alternatively, original test cases may be generated randomly or by directed pairing of instructions. This aggregate of solutions is provided to a circuit simulator. The results of the simulator are preferably maintained in a matrix or table. The results preferably detail the number of times that particular logic states or events associated with the VLSI block have been stimulated by particular test cases. The aggregate of solutions and the simulation results are then analyzed by the genetic algorithm. The genetic algorithm preferably identifies states associated with the circuit simulation that have not been produced by the original test cases. The genetic algorithm then combines characteristics of various test cases to generate new test cases. The new test cases are provided to the circuit simulator thereby providing a higher degree of confidence that the entire VLSI chip design has been simulated.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing in which.

DETAILED DESCRIPTION OF THE PREFERRED EMBODIMENT

Figure 1:
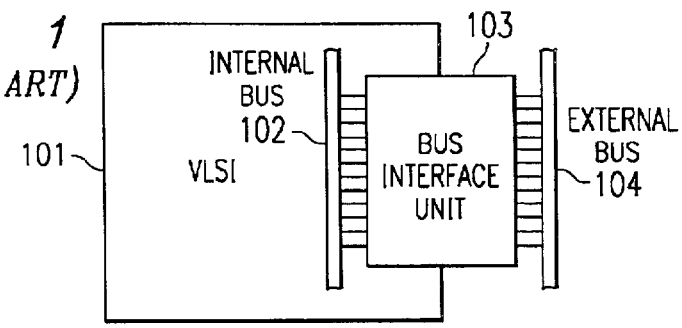
FIG. 1 illustrates an emulated VLSI circuit topology.

The present invention preferably utilizes a genetic algorithm. Typically, genetic algorithms search for a single best solution. For example, a genetic algorithm may be used to design an optimum jet engine by varying parameters such as the number of fan blades, size of fan blades, and/or the like. For test case generation associated with VLSI block circuit simulation, there is no single test case which fully tests the circuit under examination. Accordingly, the present invention preferably utilizes a genetic algorithm that generates a large population of diverse solutions, not a single solution. Moreover, the genetic algorithm preferably utilizes a plurality of solutions to generate new solutions. The genetic algorithm preferably utilizes a whole simulation history, which may be a large population of solutions, all of which might be "near" the desired output event. New test states are preferably generated based on the simulation history.

The present invention is preferably implemented via genetic algorithmic generation of test states to provide a test set which, in turn, generates output states. A genetic algorithm is an algorithm that utilizes existing non-optimal solutions that provide a degree of utility to form other solutions that provide a greater degree of utility. Specifically, a genetic algorithm analyzes existing solutions and characteristics associated with those solutions. Advantageous characteristics from a number of existing solutions are combined to form new solutions which in turn are applied to a specific application. A genetic algorithm generally involves creating a systematic encoding nomenclature to describe solutions. Furthermore, a genetic algorithm generally involves providing a mechanism to evaluate solutions. Also, genetic algorithms provide a mechanism to describe characteristics of the various solutions.

In the present system and method, the genetic algorithmic generation is preferably applied to the simulation of VLSI logic circuit blocks. The system and method preferably utilize the test case nomenclature set forth in related application, U.S. patent application Ser. No. 09/728,135, entitled "METHOD AND APPARATUS FOR ENCODING AND GENERATING TRANSACTION-BASED STIMULUS FOR SIMULATION OF VLSI CIRCUITS." Also, the system and method preferably generate a number of original test cases (solutions) as described in the preceding related application. Alternatively, original test cases may be generated randomly or by directed pairing of instructions. This aggregate of test cases is provided to a circuit simulator. The results of the simulator are preferably maintained in a matrix or table. The results preferably detail the number of times that particular cases cause or stimulate various logic states associated with the simulated VLSI block. The aggregate of solutions and the simulation results are then analyzed by the genetic algorithm. The genetic algorithm preferably identifies states associated with the circuit simulation that have not been produced by the original test cases. The genetic algorithm then combines characteristics of various test cases to generate new test cases. The new test cases are provided to the circuit simulator thereby providing a higher degree of confidence that the entire VLSI chip design has been simulated.

Figure 2:
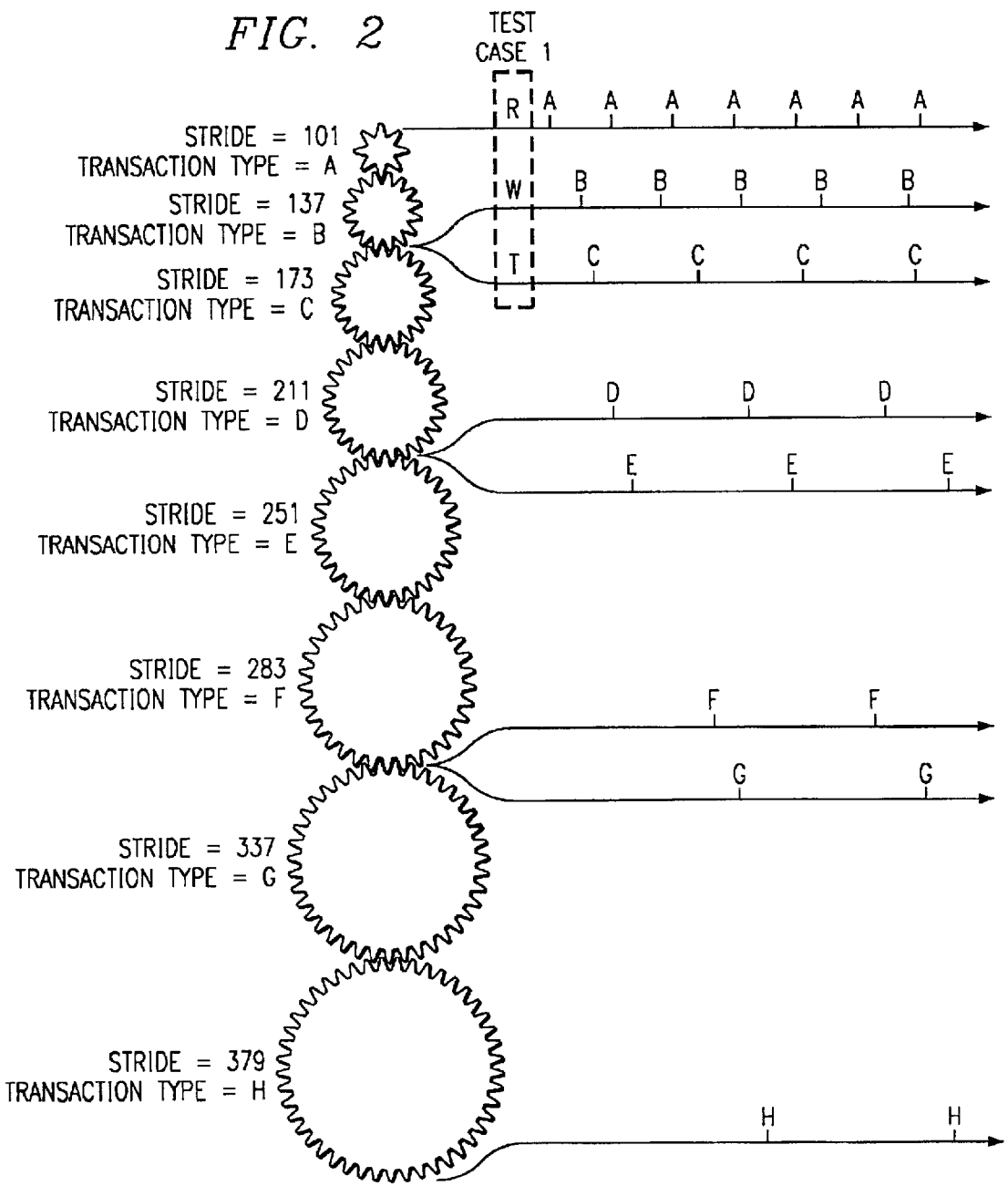
FIG. 2 illustrates several "strides," with each stride being associated with a transaction type at the stride interval.

As previously noted, the present system and method preferably utilize the test case generation mechanism utilized in the preceding application. In brief, a test generation algorithm associates transaction types (A, B, C, D, E, F, G, H) with various "strides" (101, 137, 173, 211, 251, 283, 337, 379) as depicted in FIG. 2. The "strides" are a conceptual construct that define the relative occurrence of various transactions. For example, transaction type A is associated with stride 101. Accordingly, transaction type A is executed via a simulator every 101 simulation cycles. Also, it is important to note that the strides are preferably relatively prime. Specifically, the strides preferably do not possess any common factors. By utilizing strides in this fashion, the relative timing of the various transactions may be iterated in an efficient and comprehensive manner. Moreover, it shall be appreciated that each transaction need not necessarily constitute a single operation on the bus or a single operation state. Instead, each transaction may be associated with a number of states or may be associated with a number of instructions or operations. For example, state A1 may be implemented at simulation cycle 101; state A2 may be implemented at simulation cycle 102; state A3 may be implemented at simulation cycle 103. The number of transaction states may be arbitrarily defined as desired to test a particular VLSI block or other circuit. Also, it shall be appreciated that any number of strides may be utilized. The present description only limits the number of strides to simplify the discussion of the invention.

The circuit simulation process begins by generating test cases. The development of a test case involves assigning particular instructions, operations, instruction states, and/or operation states with particular transaction types of the generation algorithm. For example, transaction type A may be assigned a specific load or write instruction. For descriptive purposes, Test Case 1 is defined by assigning instruction R to stride 101, instruction W to stride 137, and instruction T to stride 173. Accordingly, Test Case 1 may be described using the following format: (TC1:: R:101; W:137; T:173). It shall be appreciated that actual test cases may comprise any arbitrary number of instructions, operations, instruction states, and/or operation states, which are respectively associated with various strides. The present description merely limits the number of instructions to simplify the attendant discussion.

Figures 3, 4A, 4B, 5:
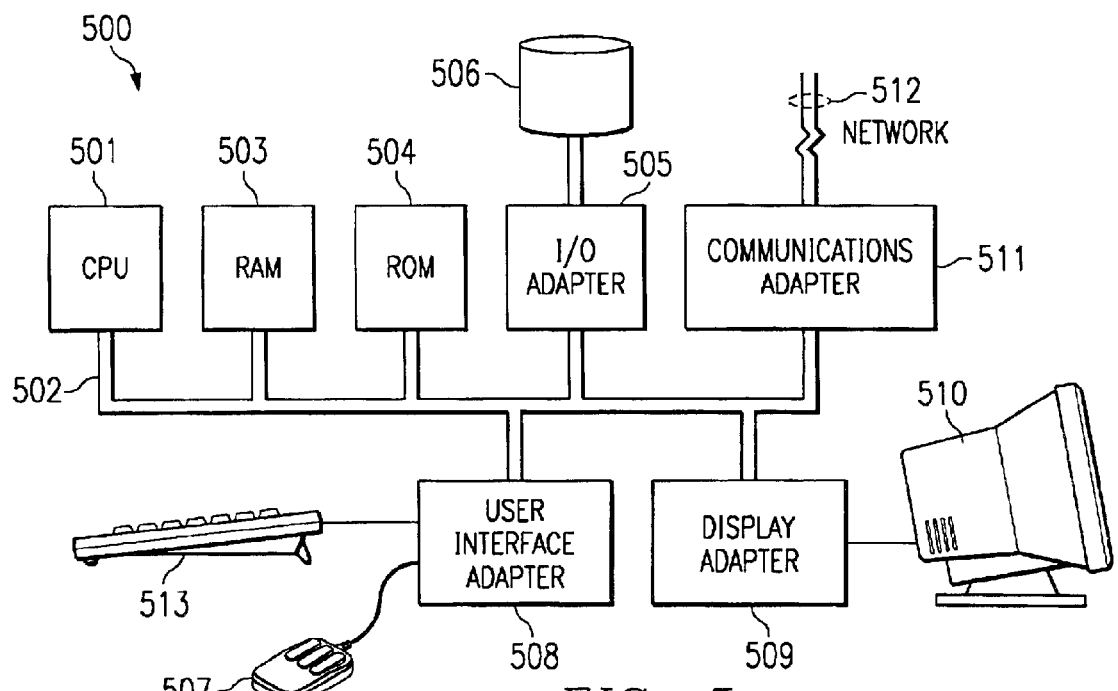
FIG. 3 illustrates a table of events versus test cases indicating the number of times that events have been stimulated by the various test cases.
FIG. 4A illustrates test cases composed of various instructions.
FIG. 4B illustrates a weighted table of instructions.
FIG. 5 depicts a block diagram of a computer system which is adapted to use the present invention.

The instructions associated with various test cases are set forth in FIG. 4A. FIG. 4A illustrates that Test Case 1 has instruction R associated with stride 101, instruction type W associated with stride 137, and instruction type T associated with stride 173. Similarly, Test Case 2 has instruction Q associated with stride 101, instruction R associated with stride 137, and instruction W associated with stride 173. Test Case 3 has instruction M associated with stride 101, instruction N associated with stride 137, and instruction Q associated with stride 173. Test Case N has instruction R associated with stride 101, instruction S associated with stride 137, and instruction T associated with stride 173.

The simulation process begins by injecting the instructions generated by the various test cases into a circuit simulator. The results of the simulation are preferably maintained in a table or matrix. FIG. 3 illustrates an illustrative table. The rows illustrate all output events that are important to the operation of the logic block. These output events represent logic states associated with the logic block. These output events are monitored to determine whether the logic block functions properly. Any arbitrary number of output events may be monitored.

For exemplary purposes, the following events shall be utilized:

Event 1=(Ev1)=$J+K+U$=($J$ and $K$ and $U$);

Event 2=(Ev2)=$J+K-U$=($J$ and $K$ and not $U$);

Event 3=(Ev3)=$K+U$=($K$ and $U$); and

Event N=(EvN)=$X+Y+J$=($X$ and $Y$ and $J$).

The columns of the table are indexed by each test case that is utilized in the circuit simulation. The entries of the table represent the number of times that a particular test case causes a specific event to occur. For illustrative purposes, it has been assumed that an entire set of test cases has been run and a total of all events has been calculated. Accordingly, Test Case 1, as shown in FIG. 3, did not stimulate the logic state associated with Event 1. However, Test Case 1 stimulated Event 2 ten times. Test Case 1 stimulated Event 3 seven times. Likewise, Test Case 1 stimulated Event N twenty times.

It shall be appreciated that an event may be a subset or a superset of another event. Alternatively, an event may be described as the compliment, negation, or inversion of one or more logic terms of another similar event. For example, in FIG. 3, Event 2=(J+K−U) or descriptively J and K and not U. Also, Event 1=(J+K+U) or descriptively J and K and U. Clearly, the events are related in that one of the logical variables is inverted. Similarly, Event 3 is (K+U) or descriptively K and U. Consequently, Event 3 is a superset of Event 2.

After tabulating the number of times that the various events have been stimulated by the respective test cases, it is desirable to identify events that have not been stimulated with sufficient frequency to provide an acceptable degree of confidence that the logic block operates appropriately with respect to those events. Accordingly, the identification process may be summarized by the following. First, the result table is searched to identify an event that has not occurred or has occurred infrequently. This event is compared to other events in the table that have occurred with some degree of frequency. Specifically, the logic definition of the non-occurring event is analyzed to determine how closely it matches the logic definition of the more frequently occurring events. Several criteria may be utilized to determine how closely such definitions match. For example, the number of terms that differ between definitions may be examined. Alternatively, the amount of overlap between a superset and a related subset may be examined. This process is iteratively repeated for each event in the table that has not occurred or has occurred infrequently.

In this example, Event 1 has not been stimulated by any of the test cases. However, it is desirable to stimulate that state to fully test the VLSI circuit. In order to construct a test case that has a likelihood of stimulating the non-occurring event (Event 1), the present system and method search the list of events for other logic events that have similar characteristics to the non-occurring event. The underlying assumption is that these similar states are "nearby" in some sense to the non-occurring event. As previously noted, several criteria may be utilized by various software routines to identify acceptable candidate events. In this case, the matching functionality would identify Event 3 as a likely candidate for analysis, since it is a superset of Event 1. Also, the matching functionality would identify Event 2 as a candidate, since its logical definition only differs from the logic definition of Event 1 by a single term. Also, the matching functionality would preferably identify Event N, since its logic definition also requires logic state J.

At this point, it is appropriate to determine which test cases have stimulated the identified similar events (Event 2, Event 3, and Event N). By examining Test Case 1, it is observed that it has stimulated each of the similar events (Event 2, Event 3, and Event N). Now, Test Case 2 has conversely only stimulated Event N. However, Test Case 2 has caused Event N to occur a significant number of times. Test Case 3 has stimulated both Event 2 and Event 3 two times respectively. Test Case 4 has only stimulated Event 2 five times.

The test cases are examined and their characteristics are weighted. Specifically, the instructions associated with the similar test cases are individually weighted to construct a new test case or test cases. Many weighting algorithms may be implemented by those possessing ordinary skill in the art. Such algorithms may utilize any number of criteria. For example, the closeness or similarity of a particular logic definition of an identified event to the logic definition of the non-occurring event preferably provides a significant weighting factor. In other words, instructions associated with events that are very close to a desired event are weighted more heavily. Also, the relative frequency that a test case with its associated instructions have stimulated the similar events preferably provides a significant weighting factor.

An exemplary weighting algorithm may assign closeness weighting factors of 2, 2, and 1 for Event 2, Event 3, and Event N, respectively, because Event 2 and Event 3 share two logic terms with Event 1 while Event N only shares a single logic term. This closeness weighting factor is multiplied by stimulation occurrence entries for the similar events. The multiplied factor is provided to each instruction by summing across test cases containing the respective instructions. For example, Test Case 1 stimulates Event 2 ten times; Event 3 seven times, and Event N 20 times. Utilizing the respective weighting factors of 2, 2, and 1, this weighting procedure provides a first score of 54. Test Case 2 stimulates Event N fifty times resulting in a second score of 50. Test Case 3 stimulates Event 2 twice, Event 3 twice, and Event N twice, thereby resulting in a third score of 10. Test Case 4 stimulates Event 2 five times, resulting in a fourth score of 10. The first, second, and fourth scores are summed giving a total weight of 114 for instruction R, since it is contained in Test Cases 1, 2, and 4. Similar calculations are performed for instructions W, T, Q, S, M, N to produce respective scores of 104, 64, 58, 10, 10, and 10. For illustrative purposes, an exemplary weighting table is provided in FIG. 4B.

Now, the weighted instructions may be utilized to construct a new test case or test cases. In actual practice, a large number of instructions will be included in the weighted table, since actual test cases comprise a significant number of instructions in typical implementations. Various methods may be utilized to select constructed test cases from the weighted table. For example, a random number generation algorithm may be utilized in conjunction with the weighted table. In this situation, each weighted table entry is divided by the sum of all of the weighted table entries. This provides a probability weight for each table entry. The instructions may then be selected randomly according to the probability weights of the instruction entries. It shall be appreciated that a single instruction may be utilized several times in a test case. For example, instruction R received a very high weighted score. Accordingly, it may be appropriate to repeat R by utilizing the test case of (R:101, W:137; R:173). Also, it may be appropriate to assign more heavily weighted instructions to lower strides. It shall further be appreciated that it is appropriate to filter the constructed test cases. Specifically, the constructed test cases should be matched against existing test cases to ensure that a repetition of an already performed simulation does not occur.

Additionally, it is possible to retain timing information related to various instructions. For example, instruction R is associated with stride 101 for Test Case 1 and Test Case 4. Likewise, instruction R is associated with stride 137 for Test Case 2. Since R has been injected into the simulations at a relatively high frequency, it may prove valuable to associate a lower stride with R in the constructed test case. Timing relationships may be selectively associated with instructions utilizing another weighting algorithm. By implementing such an approach, timing information pertaining to the instructions may be retained.

By utilizing the constructed test cases, significant improvement of VLSI simulation may be achieved. Based on an actual simulation with 6000 Events, an initial population of test cases were generated randomly. This random generation succeeded in simulating about 67% of the Events. By applying the genetic algorithm to generate constructed test cases targeted at the remaining non-occurring events, 10% of targeted events were simulated. Accordingly, the use of constructed test cases provides a far greater degree of confidence in the automated circuit simulation process.

When implemented in software, the elements of the present invention are essentially the code segments to perform the necessary tasks. The program or code segments can be stored in a processor readable medium or transmitted by a computer data signal embodied in a carrier wave, or a signal modulated by a carrier, over a transmission medium. The "processor readable medium" may include any medium that can store or transfer information. Examples of the processor readable medium include an electronic circuit, a semiconductor memory device, a ROM, a flash memory, an erasable ROM (EROM), a floppy diskette, a compact disk CD-ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, Intranet, etc.

FIG. 5 illustrates computer system 500 adapted to use the present invention. Central processing unit (CPU) 501 is coupled to system bus 502. The CPU 501 may be any general purpose CPU, such as an HP PA-8500 or Intel Pentium processor. However, the present invention is not restricted by the architecture of CPU 501 as long as CPU 501 supports the inventive operations as described herein. Bus 502 is coupled to random access memory (RAM) 503, which may be SRAM, DRAM, or SDRAM. ROM 504 is also coupled to bus 502, which may be PROM, EPROM, or EEPROM. RAM 503 and ROM 504 hold user and system data and programs as is well known in the art.

Bus 502 is also coupled to input/output (I/O) controller card 505, communications adapter card 511, user interface card 508, and display card 509. The I/O card 505 connects to storage devices 506, such as one or more of hard drive, CD drive, floppy disk drive, tape drive, to the computer system. Communications card 511 is adapted to couple the computer system 500 to a network 512, which may be one or more of telephone network, local (LAN) and/or wide-area (WAN) network, Ethernet network, and/or Internet network. User interface card 508 couples user input devices, such as keyboard 513 and pointing device 507, to the computer system 500. The display card 509 is driven by CPU 501 to control the display on display device 510.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of simulating a circuit, comprising the steps of:

identifying a set of logic events associated with said circuit, wherein the logic events are represented as data objects embodying logic equations;

generating a plurality of input test cases;

simulating operation of said circuit utilizing said plurality of input test cases;

tabulating for the plurality of input test cases and the set of logic events the numbers of times that each input test case stimulates logic event; and identifying as non-occurring events one or more logic events that have not been stimulated more than a predetermined threshold of times.

2. The method of claim 1 further comprising the steps of:

selecting one event of said non-occurring events; and comparing a logic equation of said one event against logic equations of logic events that have been stimulated more than a predetermined threshold.

3. The method of claim 2 wherein the step of comparing comprises the sub-step of:

assigning scores to compared events, wherein said scores reflect similarity to said one event.

4. The method of claim 3 further comprising the step of:

utilizing said scores and said numbers of times to weight instructions contained in said input test cases.

5. The method of claim 4 further comprising the step of:

constructing a new test case from said weighted instructions.

6. The method of claim 5 wherein each test case possesses a plurality of instructions with each instruction respectively associated with generation strides.

7. The method of claim 6 wherein the generation strides are relatively prime.

8. The method of claim 5 wherein the step of tabulating comprises the sub-step of:

recording numbers of times in a matrix.

9. The method of claim 7 wherein the step of construction comprises the sub-step of:

assigning heavily weighted instructions to lower strides.

10. The method of claim 7 wherein the step of construction comprises the sub-step of:

weighting strides associated with particular instructions.

11. A system for simulating, comprising:

a data structure including a set of logic events associated with said circuit, wherein the logic events are represented as data objects embodying logic equations;

a first software routine generating a plurality of input test cases;

a second software routine applying said plurality of input test cases to a circuit simulator;

a third software routine tabulating for the plurality of input test cases and the set of logic events the numbers of times that each input test case stimulates each logic event; and a fourth software routine identifying as non-occurring events one or more logic events that have not been stimulated more than a predetermined threshold of times.

12. The system of claim 11 further comprising:

a fifth software routine selecting one event of said non-occurring events; and a sixth software routine comparing a logic equation of said one event against logic equations of logic events that have been simulated more than a predetermined threshold.

13. The system of claim 12 wherein said sixth software routine assigns scores to compared events, wherein said scores reflect similarity to said one event.

14. The system of claim 13 further comprising:

a seventh software routine utilizing said scores and said numbers of times to weight instructions contained in said input test cases.

15. The system of claim 14 further comprising:

an eighth software routine constructing a new test case from said weighted instructions.

16. The system of claim 15 wherein each test case possesses a plurality of instructions with each instruction respectively associated with generation strides.

17. The system of claim 16 wherein the generation strides are relatively prime.

18. The system of claim 15 wherein the third software routine records numbers of times in a matrix.

19. A computer program product having a computer readable medium having programmable logic recorded thereon for testing a circuit, the computer product comprising:

means for representing a set of logic events associated with said circuit as data objects embodying logic equations;

means for generating a plurality of input test cases for application to a circuit simulator;

means for tabulating for the plurality of input test cases and the set of logic events the numbers of times that each input test case stimulates each logic event;

means for identifying as non-occurring events one or more logic events that have not been stimulated more than a predetermined threshold of times;

means for selecting one event of said non-occurring events; and means for comparing a logic equation of said one event against logic equations of logic events that have been simulated more than a predetermined threshold.

20. A computer program product of claim 19 further comprising:

means for weighting instructions contained in said input test cases utilizing output from said means for comparing and said numbers of times; and means for constructing a new test case from said weighted instructions.

* * * * *